United States Patent
Kasanyal et al.

(10) Patent No.: US 7,183,813 B2
(45) Date of Patent: Feb. 27, 2007

(54) DIFFERENTIAL SIGNALING DRIVER

(75) Inventors: Sunil Chandra Kasanyal, Uttaranchal (IN); Hari Bilash Dubey, Uttar Pradesh (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 9 days.

(21) Appl. No.: 10/985,661

(22) Filed: Nov. 10, 2004

(65) Prior Publication Data

US 2005/0179469 A1 Aug. 18, 2005

(30) Foreign Application Priority Data

Nov. 11, 2003 (IN) .................. 1384/DEL/2003

(51) Int. Cl.
*H03K 5/22* (2006.01)

(52) U.S. Cl. ........................................ 327/65; 327/108

(58) Field of Classification Search ................ 327/108, 327/112; 326/83
See application file for complete search history.

(56) References Cited

U.S. PATENT DOCUMENTS

| | | | | |
|---|---|---|---|---|
| 6,052,003 A | * | 4/2000 | Molin et al. ................. | 327/112 |
| 6,600,346 B1 | * | 7/2003 | Macaluso .................... | 327/108 |
| 6,617,888 B2 | * | 9/2003 | Volk ............................. | 327/67 |
| 6,646,482 B2 | * | 11/2003 | Takeuchi ..................... | 327/112 |
| 6,700,403 B1 | * | 3/2004 | Dillon .......................... | 326/37 |
| 6,930,518 B2 | * | 8/2005 | Kim et al. ................... | 327/112 |

\* cited by examiner

*Primary Examiner*—My-Trang Nuton

(57) ABSTRACT

The present invention provides a Differential Signaling line driver including a pre-emphasis circuit, which boosts the output drive current without any delay whenever there is a transition in the input signal to the driver, using the input signal itself to provide the pre-emphasis through a current steering circuit that switches the direction of drive currents to provide a differential output signal. A delayed signal is then used to disable the pre-emphasis after a short period.

20 Claims, 5 Drawing Sheets

DIFFERENTIAL SIGNALING DRIVER

TECHNICAL FIELD OF THE INVENTION

This invention relates to data transmission using Differential Signaling. In particular, this invention relates to a differential signaling driver that provides increased frequency response.

BACKGROUND OF THE INVENTION

Low voltage differential signaling (LVDS) is used for high speed of data transmission with reduced noise and reduced electro-magnetic interference (EMI). Modern LVDS drivers are expected to operate at GHz frequencies. The range of the differential output voltage of the LVDS driver ranges from 250 mV to 450 mV.

When a LVDS driver drives a heavy capacitive load such as a long cable or a high capacitance cable, its frequency of operation has to be decreased to get adequate output voltage differential that conforms to the specified range of 250 mV to 450 mV. To make the LVDS driver capable of operating at high frequency even for heavy capacitive loads, it is necessary to provide pre-emphasis circuitry. This pre-emphasis circuitry provides high driving capability to the LVDS driver at the time of switching, thereby significantly decreasing the charging time of the output load and making it possible to operate at high frequencies.

FIG. 1 shows a low voltage differential signaling driver with pre-emphasis circuit in accordance with U.S. Pat. No. 6,281,715. LVDS driver 100 has a capability of providing output current ID1. The pre-emphasis circuit used with this driver provides an additional current ID2 current at the time of switching making the driver capable of driving the heavy load at a faster signaling rate. The basic driver consists of a current source 10, which is capable of sourcing current ID1. Four NMOS transistors N1–N4 form a current steering circuit. The gates of these four NMOS transistors are controlled by two signals IN and IN~(both of which are complementary to each other). Resistor 15 establishes a DC voltage to satisfy the high output voltage VOH and low output voltage VOL requirements. The drains of NMOS transistors N3 and N2 are connected to an output pad X. Similarly, the drains of N1 and N4 are connected to output pad Y. Pads X and Y form a differential pair. Both pads are connected to transmission lines (not shown here) and the far end of the transmission line (at the receiver end) is connected to a 100 ohm resistor 16. PMOS transistor P5 forms another current source having its source connected to the supply VDD and its gate voltage is controlled by a bias cell 30. Bias cell 30 makes P5 capable of sourcing current ID2. NMOS transistor N5 acts as a current sink, having its source connected to ground and its gate voltage controlled by Bias cell 30. Bias cell 30 makes N5 capable of sinking current ID2. Transistors P6 and N6 are the control transistors, having their gates controlled by pre-emphasis pulse IXNOR. Pre-emphasis pulse IXNOR becomes high after each input transition. Inverter INV4 generates the complementary signal IN~. Inverters INV1–INV3 with exclusive-NOR gate XNOR form the pre-emphasis pulse generator. Inverter INV5 inverts the pre-emphasis pulse IXNOR. Transistors P7, N7 and N8 with resistor R2 form bias cell 30. This bias cell bias the PMOS P5 as current source and NMOS N5 as current sink.

Let us consider the case when the input signal is at logic low, i.e. IN=0, so IN~=1, a=0, b=1, IXNOR=0. Since IXNOR is low, NMOS N6 and PMOS P6 are switched off, so current ID2 is not provided to the output driver 100. In this case NMOS transistors N1 and N2 are on, and N3 and N4 are off, causing current ID1 to flow through resistor 16 from Y to X, setting Y to VOH and X to VOL. Similarly when IN=1, IN~=0, a=1, b=0, IXNOR=0, turning off pre-emphasis transistors N6 and P6 and providing no current to output driver 100. Since IN=1 and IN~=0, NMOS transistors N3 and N4 are on, and N1 and N2 are off. In this case current ID1 flows through resistor 16 from X to Y, producing a voltage drop across resistor 16. In this case X is at VOH and Y is at VOL. During DC operation only ID1 produces the output voltage across the pads X and Y. The ID1 current is capable of producing the appropriate differential output voltage (between 250 mV and 450 mV) across resistor 16 (Vod=ID1*RL).

When input IN changes from '0' to '1', 'a' becomes '1' immediately but 'b' is still at '1' due to the delay provided by the delay chain of inverters INV1–INV3, resulting in a positive pre-emphasis pulse at IXNOR. This pre-emphasis pulse switches N6 and P6 ON and current ID2 is supplied to output driver 100. Since IN=1, IN~=0, transistors N3 and N4 turn ON and allow current ID1+ID2 to flow through output resistor 16 from X to Y. After the time delay of inverters INV1–INV3, 'b' becomes low, which makes pre-emphasis pulse IXNOR low, which turns off transistors N6 and P6, cutting off the ID2 current supply to output driver 100.

Similarly, when input IN changes from '1' to '0', 'a' becomes '0' immediately but 'b' is still at '0', which produces a positive pre-emphasis pulse at IXNOR. This pre-emphasis pulse switches N6 and P6 on and current ID2 is supplied to output driver 100. Since IN=0, IN~=1, transistors N1 and N2 turn ON and allow current ID1+ID2 to flow through output resistor 16 from Y to X. In this manner, the LVDS driver of FIG. 1 provides an output current of ID1+ID2 at the time of input signal transitions, making it possible to drive capacitive loads at high frequency. The pre-emphasis pulse generator consists of the inverters INV–INV3 and XNOR gate XNOR.

This design of pre-emphasis is however, not suitable for very high frequency operation. This limitation arises from the fact that the output of the pre-emphasis pulse IXNOR is delayed with respect to the input signal IN by a value equal to the propagation delay of the XNOR gate. In fact, in this arrangement, whatever the circuitry is used to generate the pre-emphasis pulse IXNOR will add some delay with respect to the input signal IN. For operating frequencies up to about 500 MHz this delay of the pre-emphasis circuit is not very significant and may be ignored. However, at higher frequencies of operation, the delay of this pre-emphasis circuit becomes significant. At a frequency of 1 GHz, the pulse period is 0.5 ns and even a small propagation delay of about 100 ps significantly derates the operation of LVDS driver when driving capacitive loads. As an example, assuming the pre-emphasis circuit shows the delay of 150 ps and the operating frequency of operation is 1 GHz, the pre-emphasis current ID2 starts boosting the output driver 100 after 150 ps and has a total of 350 ps to provide this current. In this condition, the LVDS driver with pre-emphasis is not capable of providing the required swing at the output pads X and Y. To compensate for this swing one method is to increase the pre-emphasis current ID2, but this results in an unnecessary increase in the size of transistors P5 and N5. Also this design of LVDS driver with pre-emphasis contains a Bias cell 30 that causes unnecessary power dissipation.

SUMMARY OF THE INVENTION

To address the above-discussed deficiencies of the prior art, an object of this invention is to obviate the above drawbacks and provide a Differential Signaling driver with pre-emphasis that is capable of very high frequency operation.

To achieve the said objective, this invention provides a Differential Signaling line driver including a pre-emphasis circuit, which boosts the output drive current without any delay whenever there is a transition in the input signal to the driver, using the input signal itself to provide the pre-emphasis through a current steering circuit that switches the direction of drive currents to provide a differential output signal. A delayed signal is then used to disable the pre-emphasis after a short period.

Accordingly, the invention provides an improved differential signaling driver providing increased frequency response, comprising:

an output driver receiving the differential input signals and providing a differential output current to drive the load, a delay stage for delaying the transitions of said differential input signal, and a pre-emphasis stage directly driven by said differential input signals for providing an additional differential current in parallel with the output stage to boost the current to the load, said pre-emphasis stage being enabled at each transition of the input signals and disabled by the delayed transitions from the output of said delay stage.

The output driver is a current steering circuit.

The delay stage is a pair of delay chains, each comprising an even number of inverters connected in series.

The pre-emphasis stage is a pair of inverters each driven by one of the complementary input signals, each inverter comprising complementary series connected switches controlled by the delayed version of the complementary input signal.

The instant invention also provides a method for improving the frequency response of a differential signaling driver, comprising the steps of:

using the differential input signals to provide a differential output drive to the load, delaying the transitions of the differential input signals, enabling a boost current in parallel with said differential output drive, with each transition of the input differential signals, and disabling said boost current with the delayed transitions of the input differential signals.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The invention will now be explained with reference to the accompanying drawings, in which like reference numerals represent like parts, and in which.

DETAILED DESCRIPTION OF THE INVENTION

FIGS. 2 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged image processing system.

Figure 2:
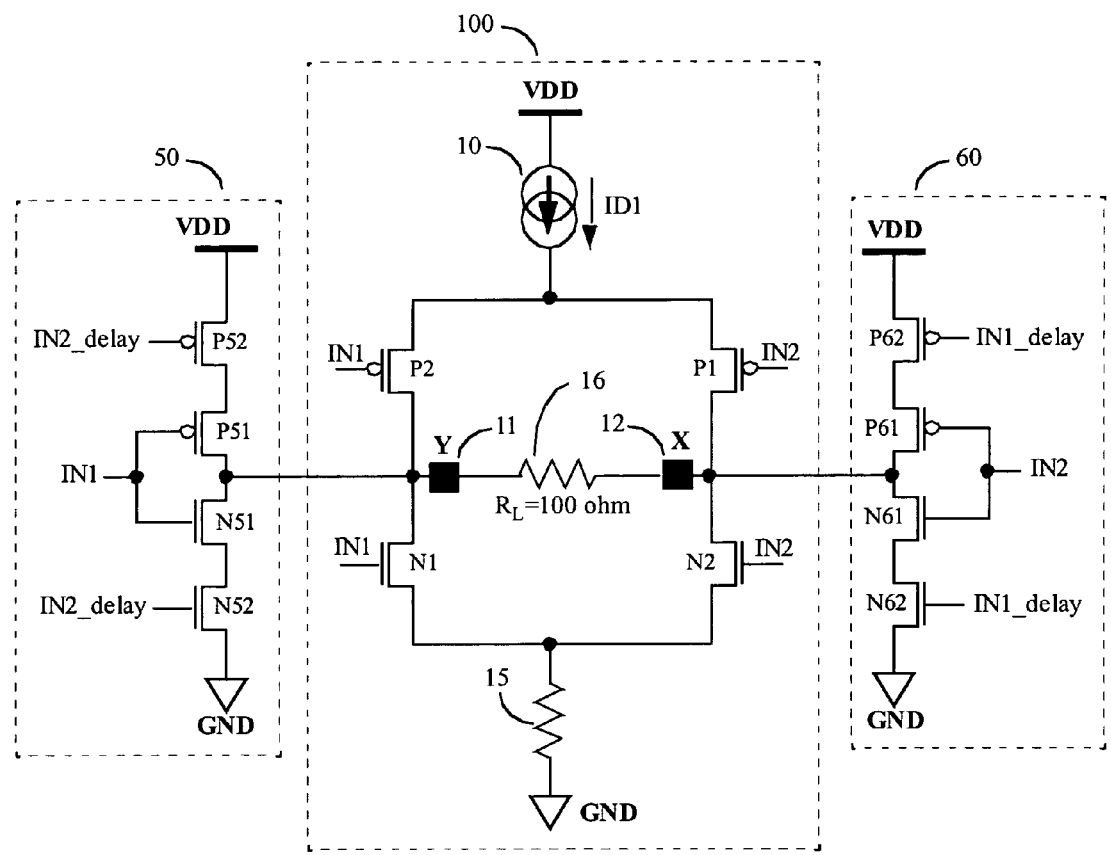
FIG. 2 shows the LVDS driver with pre-emphasis circuit according to the present invention.
Figure 2:
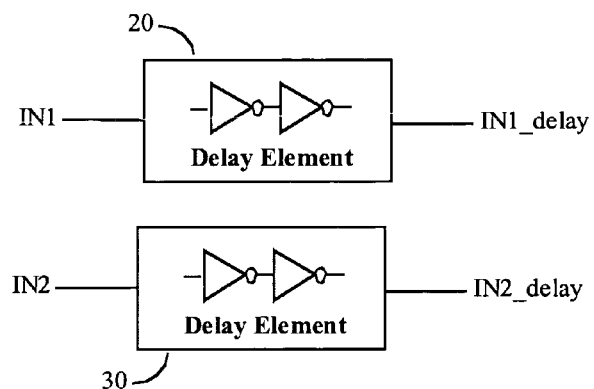

FIG. 2 shows the LVDS driver with pre-emphasis circuit according to the present invention. Block 100 is the output driver including current source 10 capable of sourcing current ID1. Resistor 15 sets high output voltage level VOH and low output voltage level VOL of the output differential signal. Four transistors P1, P2, N1, and N2 form a current steering circuit. PMOS P2 and NMOS N1 of current steering circuit have their gates connected to one input signal IN1 and their drains connected to the pad Y. PMOS transistor P1 and NMOS transistor N2 have their gates connected to the second input signal IN2 and their drains connected to the pad X. Resistor 16 (RL=100 ohm) connected between X and Y is the resistor which is actually connected at the receiver end after transmission line (not shown here). IN1 and IN2 are the two complementary input signals. Block 50 and 60 are the pre-emphasis blocks having the same architecture and connected to the pads Y and X respectively. Block 50 consists of two PMOS transistors P51 and P52 connected in series between pad Y and supply voltage VDD. Two NMOS transistors N51 and N52 are connected in series between pad Y and ground. The gates of N51 and P51 are connected to input signal IN1. The gates of transistors P52 and N52 are controlled by the signal IN2_delay, generated from delay element 30. The second pre-emphasis block 60 consists of two PMOS transistors P61 and P62 connected in series between pad X and supply VDD. Two NMOS transistors N61 and N62 are connected in series between pad X and ground. The gates of transistors N61 and P61 are controlled by input signal IN2 and the gates of P62 and N62 are controlled by signal IN_delay generated by delay element 20. Delay elements 20 and 30 are used to produce delayed signals of IN1 and IN2. Both the delay elements provide the same delay. The polarity of the output of the delay element is the same as its input signal. The delay element may consist of a chain of an even number of inverters (for examples four inverters in series). The maximum delay of the delay element must be less than the minimum pulse duration of the input signals (IN1 or IN2) i.e. maximum delay must be less than the half of the time period of the input signals. For example, if the maximum frequency of operation is 1 GHz (the time period of the input signals IN1 and IN2 is 1 ns with a 0.5 ns pulse width) the maximum delay of delay element can be 0.4 ns. For this period pre-emphasis block 50 and 60 need to have sufficient capability to drive the required capacitive load at a 1 GHz operating frequency.

Figure 3A:
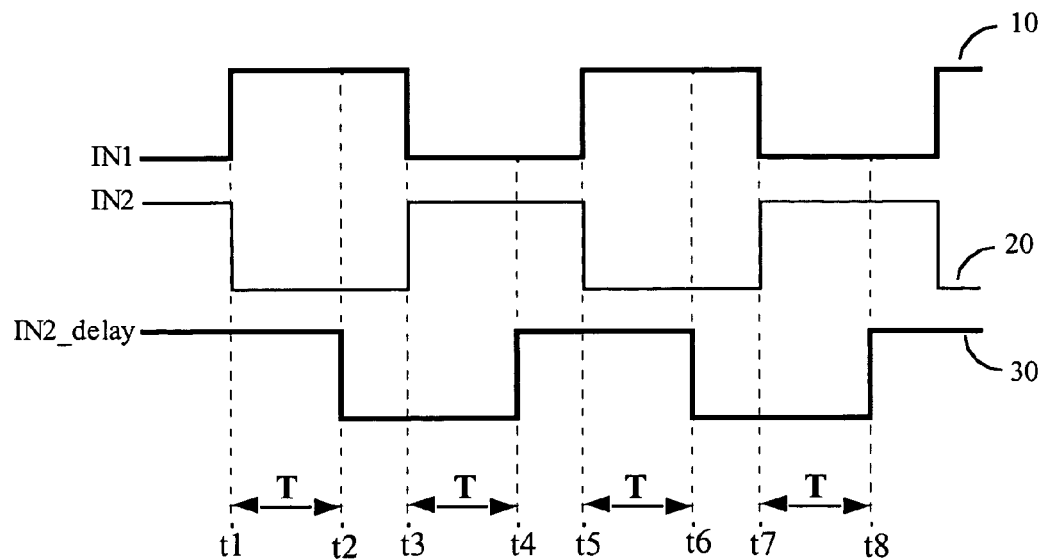
FIG. 3a and FIG. 3b shows the timing diagram of the LVDS driver with pre-emphasis according to the present invention.
Figure 3B:
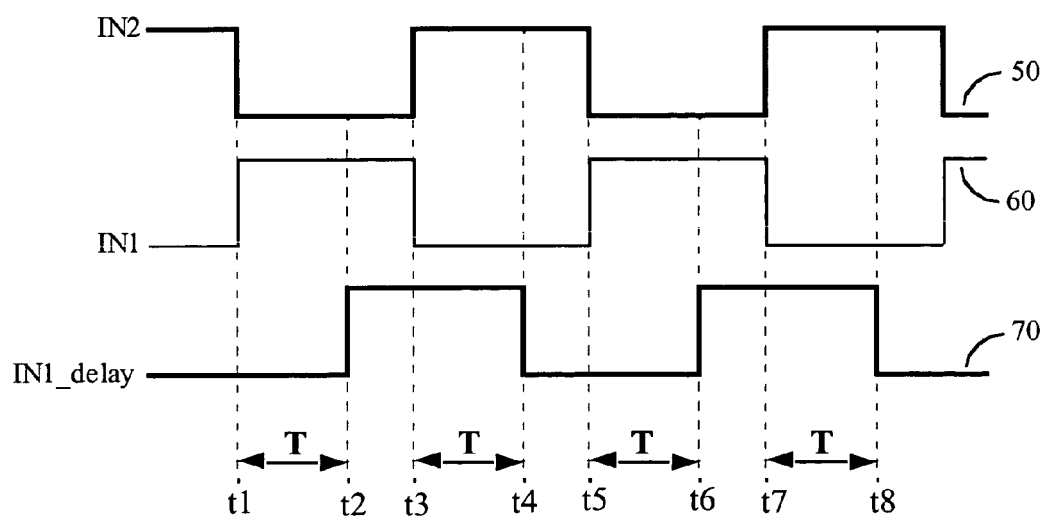

FIG. 3a and FIG. 3b show the timing diagram of the input signal and delayed signal. In FIG. 3a waveform 10 is the input IN1 and waveform 20 is input IN2. Both the signals are complementary to each other. Waveform 30 of FIG. 3a is the waveform of the delayed signal IN2_delay. The delay provided by the delay element 30 is T. When IN1 goes high at t1 IN2 goes low and IN2_delay goes low at t2 after a delay of T as shown. Similarly when IN1 goes low at t3, IN2 goes high and IN2_delay goes high at t4 after a delay of T. In FIG. 3b waveform 50 is the waveform of IN2, waveform 60 is the waveform of IN1 and waveform 70 is the waveform of signal IN1_delay. Delay element 20 provides a delay of T to the input signal IN1.

When at time t1 input signal IN1 rises from '0' to '1', IN2 falls from '1' to '0'. At this time t1, IN1=1, IN2=0. From FIG. 3a and FIG. 3b at time t1, IN1_delay=0 and IN2_delay=1. In block 100 of FIG. 2, transistors N1 and P1 are on and transistors P2 and N2 are off. This causes current ID1 to flow from transistor P1 through resistor 16 and transistor N1 to resistor 15. Pad X has high output voltage VOH and pad Y has low output voltage VOL. In pre-emphasis block 50, at time t1, IN1 and IN2_delay are both '1', turning on NMOS transistors N51 and N52 on thereby assisting pad Y to come to VOL level at a faster rate for high load at pad Y. Also at a time just before t1, IN2_delay is '1', so transistor N52 is already on before IN1 becomes '1' and switches N51 on. In the same manner, for pre-emphasis block 60, at time t1, IN2 is '0' and IN1_delay is '0', which turns on PMOS transistors P62 and P61 and NMOS transistors N61 and N62 off. This assists pad X in reaching the VOH level at a faster rate. At time t2, IN1 and IN2 are '1' and '0' respectively, IN1_delay changes its state from '0' to '1' and IN2_delay changes its state from '1' to '0'. Since at time t2, IN2_delay becomes '0', this switches off NMOS transistor N52 and disables the sinking path for pad Y. For pre-emphasis block 50, at t2 P52 is on but P51 is off, so after time t2 pre-emphasis block 50 is isolated from the output driver 100. For block 60, at time t2, IN2 is 0 and IN1_delay is '1', which switches P62 off and disables the sourcing path for pad X. For block 60, at time t2 N61 is off. So after time t2 pre-emphasis block 60 is isolated from output driver 100.

At time t3, IN1 switches from '1' to '0' and IN2 switches from '0' to '1' but IN1_delay and IN2_delay remain at their previous states. In output driver 100, at time t3, P2 and N2 are on and P1 and N1 are off. Current ID1 flows from transistor P2 through resistor 16 (from Y to X), transistor N2 and resistor 15 to ground. Pad Y will be at higher voltage than pad X. For pre-emphasis block 50, at time t3 (IN1=0 and IN2_delay=0), P51 and P52 are on, N51 and N52 are off. Therefore block 50 attempts to pull the pad Y towards the higher voltage level thereby assisting output driver 100. For pre-emphasis block 60 at time t3, IN2=1 and IN1_delay=1, which switches N61 and N62 on and P61 and P62 are off. Block 60 tries to pull the pad X towards the lower voltage level. Since output driver 100 is also pulling the pad X towards lower voltage, the pre-emphasis circuit boosts it. In this manner, when there is a transition of IN1 and IN2 at t3, boosting is provided by pre-emphasis blocks 50 and 60.

At time t4, after the delay of T from t3, IN1 and IN2 have same signaling status as at t3 but IN1_delay changes from '1' to '0' and IN2_delay changes from '0' to '1'. So at time t4 for block 50 IN1=0 and IN2_delay=1, PMOS P52 is off, PMOS P51 is on, NMOS N51 is off and NMOS N52 is on. After time t4, block 50 stops pulling the pad Y towards the high voltage level and since the NMOS path is also off, block 50 is isolated from the output driver 100 after time t4. For block 60, IN2=1 and IN1_delay=0, N62 is off N61 is on, P61 is off and P62 is on. Again after time t4 block 60 stops boosting the pad X towards the lower voltage level.

In this manner, for each transition, pre-emphasis blocks 50 and 60 boost current to the pads Y and X respectively and after a time delay of T, blocks 50 and 60 are isolated from the respective pads. This time period T can be defined as the pre-emphasis period. The pre-emphasis period must be less than the minimum pulse duration (maximum operating frequency) of the input signal IN1 and IN2.

Figure 1:
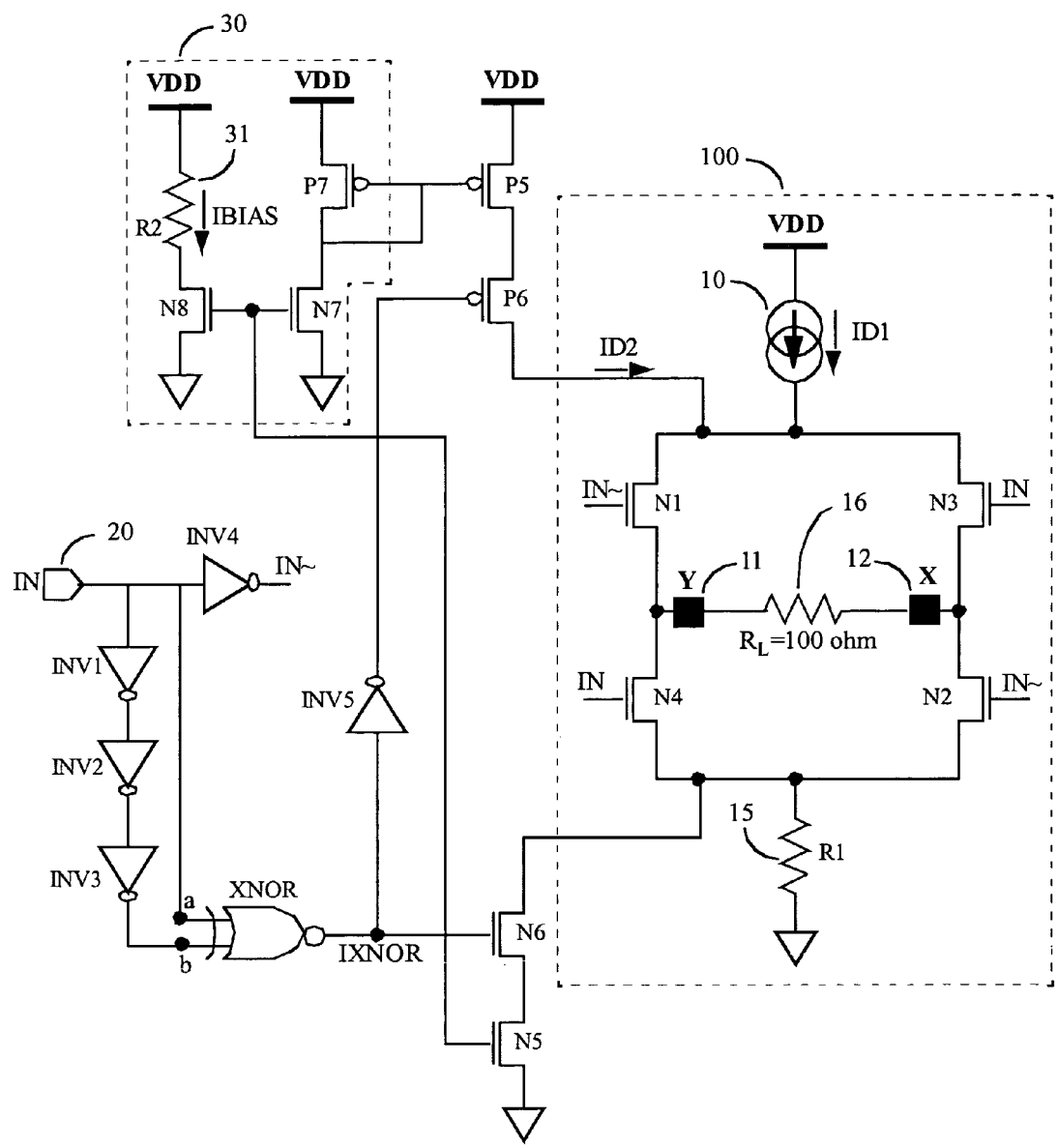
FIG. 1 shows the LVDS driver with pre-emphasis circuit according to the prior art.

The main advantage of the LVDS driver with pre-emphasis circuit of the present invention is that it starts boosting the output current to the output as soon as input signal changes its state. Pre-emphasis blocks 50 and 60 are directly controlled by the input signals IN1 and IN2. As shown in FIG. 3a and FIG. 3b the pre-emphasis period for the low to high transition of IN1, starts at time t1 when IN1 changes its state and it remains for time T upto t2 which is less than the pulse duration of IN1 (pulse duration for IN1 is from time t1 to t3). For this period of time pre-emphasis blocks 50 and 60 need to have sufficient driving capability to drive the load. In the prior art, pre-emphasis current source transistor P5 and current sink transistor N5 have their gates connected to a bias voltage (which is an intermediate voltage, neither zero nor one) provided by the bias cell 30. Higher sourcing and sinking capability in P5 and N5, requires their sizes to be kept large. On the other hand, in the present the gates of all pre-emphasis transistors (P51–52, N51–52, P61–62, and N61–62) are controlled by digital signal levels making it possible to provide the same drive capability with smaller transistors. Also no extra bias cell (as of bias cell 30 of FIG. 1) is required.

Figure 4:
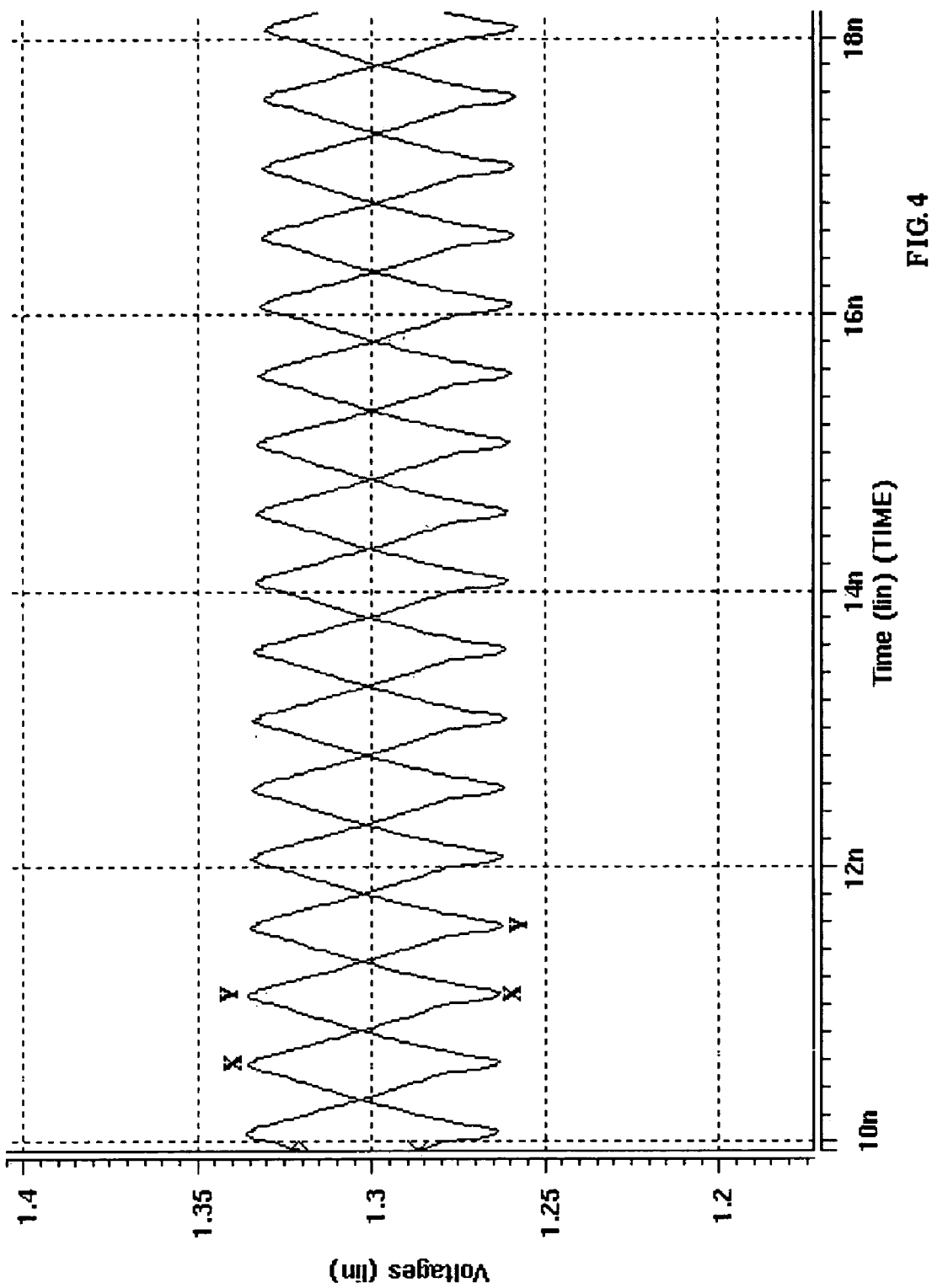
FIG. 4 Shows the output waveform of the LVDS driver without pre-emphasis circuit.

FIG. 4 shows the waveform at the output of block 100 without the pre-emphasis circuitry. This is the output wave form at 1 GHz frequency for 25 pf load. As it can be seen from the wave forms of X and Y, the output voltage difference is below the minimum limit (250 mV). For this particular example the output differential swing is around 72 mV. To get the required swing at output for this high capacitive load, the frequency of the operation would have to be reduced.

Figure 5:
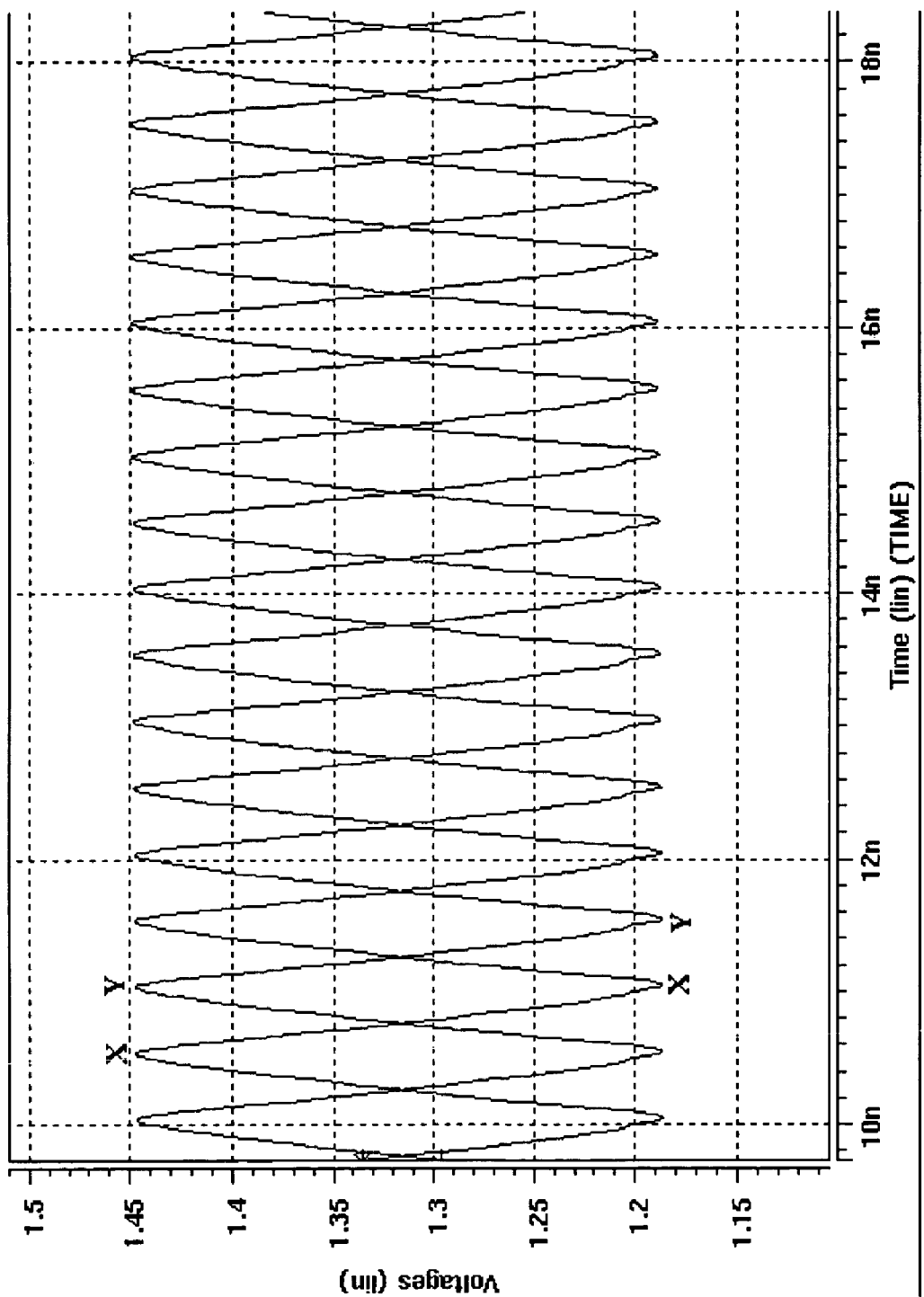
FIG. 5 shows the output waveform of the LVDS driver with pre-emphasis circuit.

FIG. 5 shows the waveform of the LVDS driver with the pre-emphasis circuitry of present invention. This is the waveform for 25 pf load and at 1 GHz operating frequency. The output differential swing in this case is around 260 mV confirming the capability of the LVDS driver of the present invention for driving high capacitive loads at high frequency.

It will be apparent to those with ordinary skill in the art that the foregoing is merely illustrative intended to be exhaustive or limiting, having been presented by way of example only and that various modifications can be made within the scope of the above invention.

Accordingly, this invention is not to be considered limited to the specific examples chosen for purposes of disclosure, but rather to cover all changes and modifications, which do not constitute departures from the permissible scope of the present invention. The invention is therefore not limited by the description contained herein or by the drawings, but only by the claims. It is intended that the present invention encompass such changes and modifications as fall within the scope of the appended claims.

What is claimed is:

1. An integrated circuit for differential signaling, comprising:
an output driver capable of producing a differential output current in response to a differential signal input;
a delay element capable of delaying the differential signal input by a predetermined time to produce a delayed differential signal input having the same polarity as the differential signal input; and
a pre-emphasis circuit capable of supplying a pre-emphasis differential output current in parallel with the output driver,
wherein the pre-emphasis differential output current is supplied from the time of a transition in the differential signal input until the time of a corresponding transition in the delayed differential signal input.

2. The integrated circuit of claim 1, wherein the output driver comprises a current steering circuit.

3. The integrated circuit of claim 1, wherein the delay element comprises a plurality of series connected inverters.

4. The integrated circuit of claim 3, wherein the number of series connected inverters is even.

5. The integrated circuit of claim 1, wherein
the differential signal input comprises first and second signals,
the delayed differential signal input comprises corresponding delayed first and delayed second signals, and
the pre-emphasis circuit supplies pre-emphasis output current when the first signal and the delayed second signal have the same logic level.

6. The integrated circuit of claim 1, wherein
the differential signal input comprises first and second signals,
the delayed differential signal input comprises corresponding delayed first and delayed second signals,
the pre-emphasis circuit comprises a first switch coupled to the delayed second signal and a second switch coupled to the first signal,
and wherein the first switch couples the second switch to one of a source and a sink of pre-emphasis output current responsive to the delayed second signal, and the second switch couples the first switch to the output driver responsive to the first signal.

7. The integrated circuit of claim 1, wherein
the differential signal input comprises first and second signals,
the delayed differential signal input comprises corresponding delayed first and delayed second signals,
the pre-emphasis circuit comprises an inverter coupled to the first signal and the output driver, the inverter having an enabling input coupled to the delayed second signal,
and wherein the pre-emphasis circuit inverts a logic level of the first signal when enabled by the delayed second signal.

8. A method of differential signaling, comprising the steps of:
producing a primary differential output current in response to a differential signal input;
generating a delayed differential signal input by delaying the differential signal input for a predetermined time, the delayed differential signal having the same polarity as the differential signal input; and
supplying a pre-emphasis differential output current in parallel with the primary differential output current, wherein the pre-emphasis differential output current is supplied from the time of a transition in the differential signal input until the time of a corresponding transition in the delayed differential signal input.

9. The method of claim 8, wherein the step of generating a delayed differential signal input comprises the step of delaying the differential signal input utilizing a plurality of series connected inverters.

10. The method of claim 9, wherein the number of series connected inverters is even.

11. The method of claim 8, wherein
the differential signal input comprises first and second signals,
the delayed differential signal input comprises corresponding delayed first and delayed second signals, and
the step of supplying a pre-emphasis differential output current comprises the step of producing a pre-emphasis output current when the first signal and the delayed second signal have the same logic level.

12. The method of claim 8, wherein
the differential signal input comprises first and second signals,
the delayed differential signal input comprises corresponding delayed first and delayed second signals, and
the step of supplying a pre-emphasis differential output current comprises the steps of:
responsive to the delayed second signal, selecting one of a source and a sink of pre-emphasis output current, and
responsive to the first signal, selectively presenting the selected source or sink of pre-emphasis output current.

13. The method of claim 8, wherein
the differential signal input comprises first and second signals,
the delayed differential signal input comprises corresponding delayed first and delayed second signals, and
the step of producing a pre-emphasis differential output current comprises the step of enabling an inverter responsive to the delayed second signal, wherein the inverter inverts a logic level of the first signal.

14. A system for differential signaling, comprising:
an output driver capable of producing a differential output current in response to a differential signal input;
a delay element capable of delaying the differential signal input by a predetermined time to produce a delayed differential signal input having the same polarity as the differential signal input; and
a pre-emphasis circuit capable of supplying a pre-emphasis differential output current in parallel with the output driver,
wherein the pre-emphasis differential output current is supplied from the time of a transition in the differential signal input until the time of a corresponding transition in the delayed differential signal input.

15. The integrated circuit of claim 14, wherein the output driver comprises a current steering circuit.

16. The system of claim 14, wherein the delay element comprises a plurality of series connected inverters.

17. The system of claim 16, wherein the number of series connected inverters is even.

18. The system of claim 14, wherein
the differential signal input comprises first and second signals,
the delayed differential signal input comprises corresponding delayed first and delayed second signals, and
the pre-emphasis circuit supplies pre-emphasis output current when the first signal and the delayed second signal have the same logic level.

19. The system of claim 14, wherein
the differential signal input comprises first and second signals,
the delayed differential signal input comprises corresponding delayed first and delayed second signals,
the pre-emphasis circuit comprises a first switch coupled to the delayed second signal and a second switch coupled to the first signal,
and wherein the first switch couples the second switch to one of a source and a sink of pre-emphasis output current responsive to the delayed second signal, and the second switch couples the first switch to the output driver responsive to the first signal.

20. The system of claim 14, wherein
the differential signal input comprises first and second signals,
the delayed differential signal input comprises corresponding delayed first and delayed second signals,
the pre-emphasis circuit comprises an inverter coupled to the first signal and the output driver, the inverter having an enabling input coupled to the delayed second signal,
and wherein the pre-emphasis circuit inverts a logic level of the first signal when enabled by the delayed second signal.

* * * * *